(12) United States Patent
Lee

(10) Patent No.: US 10,360,957 B2
(45) Date of Patent: Jul. 23, 2019

(54) SEMICONDUCTOR DEVICE AND SEMICONDUCTOR SYSTEM

(71) Applicant: SK hynix Inc., Icheon-si, Gyeonggi-do (KR)

(72) Inventor: Jae Young Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/713,035

(22) Filed: Sep. 22, 2017

(65) Prior Publication Data

US 2018/0182441 A1   Jun. 28, 2018

(30) Foreign Application Priority Data

Dec. 28, 2016   (KR) .................. 10-2016-0180872

(51) Int. Cl.
*G11C 7/22* (2006.01)
*G11C 7/10* (2006.01)
*G11C 7/16* (2006.01)

(52) U.S. Cl.
CPC .............. *G11C 7/227* (2013.01); *G11C 7/109* (2013.01); *G11C 7/16* (2013.01); *G11C 7/22* (2013.01); *G11C 7/222* (2013.01)

(58) Field of Classification Search
CPC ............ G11C 7/227; G11C 7/109; G11C 7/16

USPC ......................................................... 365/193
See application file for complete search history.

(56) References Cited

U.S. PATENT DOCUMENTS

| | | | | |
|---|---|---|---|---|
| 5,731,924 A * | 3/1998 | Yun | ......................... | G11B 5/553 |
| | | | | 360/77.01 |
| 2007/0024306 A1 * | 2/2007 | Jeddeloh | .......... | G01R 31/31905 |
| | | | | 324/756.07 |
| 2010/0137025 A1 * | 6/2010 | Tal | ......................... | H04B 15/02 |
| | | | | 455/553.1 |

FOREIGN PATENT DOCUMENTS

KR          100606715 B1    8/2006

* cited by examiner

*Primary Examiner* — Anthan Tran
(74) *Attorney, Agent, or Firm* — William Park & Associates LTD.

(57) ABSTRACT

Disclosed are a semiconductor device and a semiconductor system. The semiconductor device includes a command processing circuit for generating a write enable signal and a read enable signal in response to a command, a data strobe signal processing circuit for generating a data strobe signal in response to a clock and the read enable signal or for receiving the data strobe signal in response to the write enable signal and outputting a write data strobe signal, and a data processing circuit for converting analog data into digital data in response to the write data strobe signal and the write enable signal and converting the digital data into the analog data in response to the read enable signal.

10 Claims, 1 Drawing Sheet

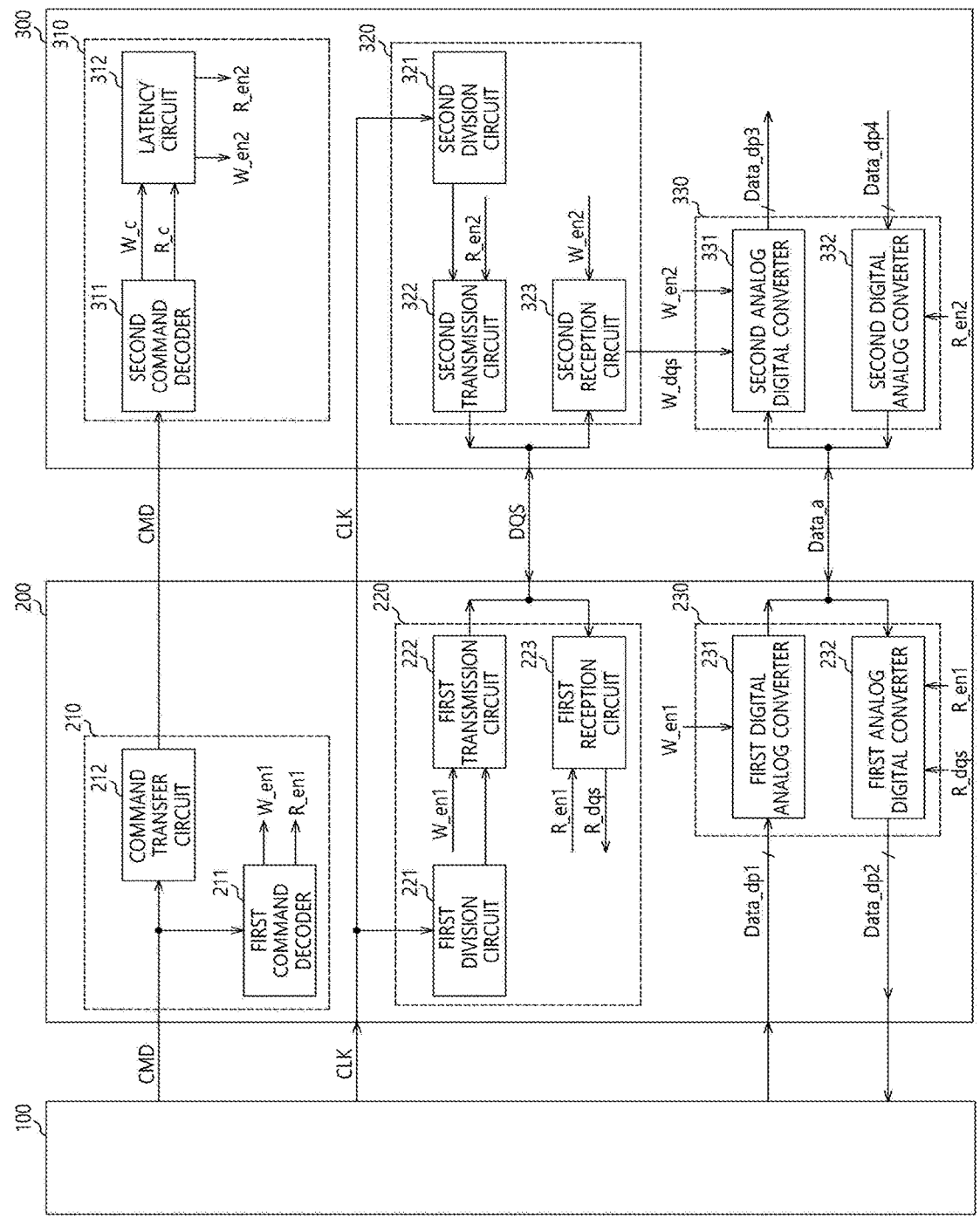

SEMICONDUCTOR DEVICE AND SEMICONDUCTOR SYSTEM

CROSS-REFERENCE TO RELATED APPLICATION(S)

The present application claims priority to Korean Patent Application No. 10-2016-0180872, filed on Dec. 28, 2016, which is incorporated herein by reference in its entirety.

BACKGROUND

1. Technical Field

Example embodiments of the present invention relate to a semiconductor integrated circuit, and more particularly, to a semiconductor device and a semiconductor system.

2. Description of the Related Art

As the operating speed of a semiconductor device is enhanced, the semiconductor device is configured to input or output a command, data, and an address by synchronizing them with a clock.

As the operating speed of a semiconductor device and a semiconductor system including a semiconductor device is increased, the frequency of the clock is increased.

If the frequency of the clock is increased, a valid section of signals transmitted or received in synchronization with the clock, that is, a command, an address, and data, is shortened. As the valid section of the signal is shortened, there is a need for technology capable of accurately reading a signal.

SUMMARY

In an embodiment, a semiconductor device may include a command processing circuit configured to generate a write enable signal and a read enable signal in response to a command, a data strobe signal processing circuit configured to generate a data strobe signal in response to a clock and the read enable signal or receive the data strobe signal in response to the write enable signal and output a write data strobe signal, and a data processing circuit configured to convert analog data into digital data in response to the write data strobe signal and the write enable signal and convert the digital data into the analog data in response to the read enable signal.

In an embodiment, a semiconductor system may include a first circuit configured to convert first parallel digital data into analog data or converting analog data into second parallel digital data in response to a command and a clock, and a second circuit configured to convert the analog data received from the first circuit into third parallel digital data or convert fourth parallel digital data into the analog data and provide the converted analog data to the first circuit in response to the command and the clock.

In an embodiment, a semiconductor system may include a controller configured to provide a command, a clock, and first parallel digital data; an interface circuit configured to convert the first parallel digital data into analog data or convert analog data into second parallel digital data and provide the second parallel digital data to the controller in response to the command and the clock; and a semiconductor device configured to convert the analog data into third parallel digital data or convert fourth parallel digital data into the analog data and provide the converted analog data to the interface circuit in response to the command and the clock.

BRIEF DESCRIPTION OF THE DRAWING

FIG. 1 shows a configuration disclosing a semiconductor device and a semiconductor system including the semiconductor device in accordance with an embodiment of the present invention.

DETAILED DESCRIPTION

Various embodiments will be described below in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various FIGURES and embodiments of the present disclosure.

As shown in FIG. 1, a semiconductor system in accordance with an embodiment of the present disclosure may include a first circuit 100, a second circuit 200, and a third circuit 300.

The first circuit 100 may include a controller 100. The second circuit 200 may include an interface circuit 200. The third circuit 300 may include a semiconductor device 300. In the following description, the first circuit 100 has been illustrated as being the controller 100, the second circuit 200 has been illustrated as being the interface circuit 200, and the third circuit 300 has been illustrated as being the semiconductor device 300, but the present disclosure is not limited thereto.

The controller 100 may provide a command CMD, a clock CLK, and digital data including first parallel digital data Data_dp1 for example, to the interface circuit 200. Furthermore, the controller 100 may receive the digital data including second parallel digital data Data_dp2 for example, from the interface circuit 200.

The interface circuit 200 may transfer the command CMD and the clock CLK, received from the controller 100, to the semiconductor device 300. Furthermore, the interface circuit 200 may divide the clock CLK and provide the divided clocks to the semiconductor device 300 as a data strobe signal DQS. The interface circuit 200 may convert the first parallel digital data Data_dp1 into analog data Data_a and provide the converted data to the semiconductor device 300. The interface circuit 200 may generate the second parallel digital data Data_dp2 by converting the analog data Data_a received from the semiconductor device 300. Thus, the interface circuit 200 may convert the first parallel digital data Data_dp1 into analog data Data_a and may convert the analog data Data_a into second parallel digital data Data_dp2 in response to the command CMD and the clock CLK. The interface circuit 200 may provide the second parallel digital data Data_dp2 to the controller 100.

The interface circuit 200 may include a first command processing circuit 210, a first data strobe signal processing circuit 220, and a first data processing circuit 230.

The first command processing circuit 210 may transfer the command CMD, received from the controller 100, to the semiconductor device 300, and may generate a first write enable signal W_en1 and a first read enable signal R_en1 by decoding the command CMD received from the controller 100.

The first command processing circuit 210 may include a command transfer circuit 212 and a first command decoder 211.

The command transfer circuit 212 may transfer the command CMD, received from the controller 100, to the semiconductor device 300.

The first command decoder 211 may enable one of the first write enable signal W_en1 and the first read enable signal R_en1 by decoding the command CMD received from the controller 100.

The first data strobe signal processing circuit 220 may divide the clock CLK and provide the divided clocks to the semiconductor device 300 as the data strobe signal DQS. Furthermore, the first data strobe signal processing circuit 220 may receive the data strobe signal DQS from the semiconductor device 300 and output the data strobe signal DQS as a read data strobe signal R_dqs.

The first data strobe signal processing circuit 220 may include a first division circuit 221, a first transmission circuit 222, and a first reception circuit 223.

The first division circuit 221 may divide the clock CLK and transmit the divided clocks to the first transmission circuit 222. For example, the first division circuit 221 may divide the clock CLK into four and transfer the divided clock to the first transmission circuit 222

The first transmission circuit 222 may transfer the output of the first division circuit 221 to the semiconductor device 300 as the data strobe signal DQS in response to the first write enable signal W_en1. For example, when the first write enable signal W_en1 is enabled, the first transmission circuit 222 may transfer the output of the first division circuit 221 to the semiconductor device 300 as the data strobe signal DQS.

The first reception circuit 223 may output the data strobe signal DQS, received from the semiconductor device 300, as the read data strobe signal R_dqs in response to the first read enable signal R_en1. For example, when the first read enable signal R_en1 is enabled, the first reception circuit 223 may output the data strobe signal DQS, received from the semiconductor device 300, as the read data strobe signal R_dqs.

The first data processing circuit 230 may generate the analog data Data_a by converting the first parallel digital data Data_dp1 in response to the first write enable signal W_en1, and may output the analog data Data_a to the semiconductor device 300. The first data processing circuit 230 may convert the analog data Data_a, received from the semiconductor device 300, in response to the enabled first read enable signal R_en1 and the enabled read data strobe signal R_dqs, and may provide the converted data to the controller 100 as the second parallel digital data Data_dp2.

The first data processing circuit 230 may include a first digital analog converter 231 and a first analog digital converter 232.

The first digital analog converter 231 may convert the first parallel digital data Data_dp1 into the analog data Data_a in response to the first write enable signal W_en1, and may provide the analog data Data_a to the semiconductor device 300. For example, the first digital analog converter 231 may be activated when the first write enable signal W_en1 is enabled. The activated first digital analog converter 231 may determine a voltage level of the analog data Data_a based on a data value of the first parallel digital data Data_dp1 having a plurality of bits, and may provide the analog data Data_a having the determined voltage level to the semiconductor device 300.

More specifically, the operation of the first digital analog converter 231 is described below with reference to Table 1. In this case, it is assumed that the first parallel digital data Data_dp1 is parallel data of 3 bits. It is to be noted that Table 1 illustrates an operation of the first digital analog converter 231, but the operation of the first digital analog converter 231 is not limited to the numerical values listed in Table 1.

TABLE 1

| Data_dp1 | | | Data_a |
|---|---|---|---|
| 0 | 0 | 0 | 0.1 V |
| 0 | 0 | 1 | 0.2 V |
| 0 | 1 | 0 | 0.3 V |
| 0 | 1 | 1 | 0.4 V |
| 1 | 0 | 0 | 0.5 V |
| 1 | 0 | 1 | 0.6 V |
| 1 | 1 | 0 | 0.7 V |
| 1 | 1 | 1 | 0.8 V |

When the first parallel digital data Data_dp1 having 3 bits is input to the activated first digital analog converter 231, the first digital analog converter 231 may determine a voltage level of the analog data Data_a based on a data value of the first parallel digital data Data_dp1, and may output the analog data Data_a having the determined voltage level.

As illustrated in Table 1, if the data value of the first parallel digital data Data_dp1 is (0, 0, 0), the voltage level of the analog data Data_a may be 0.1 V. If the data value of the first parallel digital data Data_dp1 is (0, 0, 1), the voltage level of the analog data Data_a may be 0.2 V. If the data value of the first parallel digital data Data_dp1 is (0, 1, 0), the voltage level of the analog data Data_a may be 0.3 V. If the data value of the first parallel digital data Data_dp1 is (0, 1, 1), the voltage level of the analog data Data_a may be 0.4 V. If the data value of the first parallel digital data Data_dp1 is (1, 0, 0), the voltage level of the analog data Data_a may be 0.5 V. If the data value of the first parallel digital data Data_dp1 is (1, 0, 1), the voltage level of the analog data Data_a may be 0.6 V. If the data value of the first parallel digital data Data_dp1 is (1, 1, 0), the voltage level of the analog data Data_a may be 0.7 V. If the data value of the first parallel digital data Data_dp1 is (1, 1, 1), the voltage level of the analog data Data_a may be 0.8 V.

The first analog digital converter 232 may convert the analog data Data_a into the second parallel digital data Data_dp2 in response to the first read enable signal R_en1 and the read data strobe signal R_dqs, and may provide the second parallel digital data Data_dp2 to the controller 100. For example, the first analog digital converter 232 may be activated in the section in which the first read enable signal R_en1 is enabled and the read data strobe signal R_dqs is enabled to a specific level (e.g., a high level). When the first analog digital converter 232 is activated, it converts the analog data Data_a into the second parallel digital data Data_dp2.

More specifically, the operation of the first analog digital converter 232 is described below with reference to Table 2. In this case, it is assumed that the second parallel digital data Data_dp2 is parallel data of 3 bits. It is to be noted that Table 2 illustrates an operation of the first analog digital converter 232, but the operation of the first analog digital converter 232 is not limited to the numerical values listed in Table 2.

TABLE 2

| Data_a | Data_dp2 | | |
|---|---|---|---|
| 0.1 V | 0 | 0 | 0 |
| 0.2 V | 0 | 0 | 1 |
| 0.3 V | 0 | 1 | 0 |
| 0.4 V | 0 | 1 | 1 |
| 0.5 V | 1 | 0 | 0 |
| 0.6 V | 1 | 0 | 1 |
| 0.7 V | 1 | 1 | 0 |
| 0.8 V | 1 | 1 | 1 |

When the analog data Data_a is input to the activated first analog digital converter 232, the first analog digital converter 232 may determine a data value of the second parallel digital data Data_dp2 based on a voltage level of the analog data Data_a, and may output the second parallel digital data Data_dp2 having the determined data value.

As in Table 2, if the voltage level of the analog data Data_a is 0.1 V, the data value of the second parallel digital data Data_dp2 may be (0, 0, 0). If the voltage level of the analog data Data_a is 0.2 V, the data value of the second parallel digital data Data_dp2 may be (0, 0, 1). If the voltage level of the analog data Data_a is 0.3 V, the data value of the second parallel digital data Data_dp2 may be (0, 1, 0). If the voltage level the analog data Data_a is 0.4 V, the data value of the second parallel digital data Data_dp2 may be (0, 1, 1). If the voltage level of the analog data Data_a is 0.5 V, the data value of the second parallel digital data Data_dp2 may be (1, 0, 0). If the voltage level of the analog data Data_a is 0.6 V, the data value of the second parallel digital data Data_dp2 may be (1, 0, 1). If the voltage level of the analog data Data_a is 0.7 V, the data value of the second parallel digital data Data_dp2 may be (1, 1, 0). If the voltage level of the analog data Data_a is 0.8 V, the data value of the second parallel digital data Data_dp2 may be (1, 1, 1).

The semiconductor device 300 may convert the analog data Data_a into the digital data represented by third parallel digital data Data_dp3 in response to at least one of the command CMD, the clock CLK, and the data strobe signal DQS received from the interface circuit 200. Furthermore, the semiconductor device 300 may convert the digital data including fourth parallel data Data_dp4 for example, into the analog data Data_a in response to the command CMD and the clock CLK received from the interface circuit 200, and may provide the converted analog data Data_a and the data strobe signal DQS to the interface circuit 200 also in response to the command CMD and the clock CLK.

The semiconductor device 300 may include a second command processing circuit 310, a second data strobe signal processing circuit 320, and a second data processing circuit 330.

The second command processing circuit 310 may generate a second write enable signal W_en2 and a second read enable signal R_en2 in response to the command CMD received from the interface circuit 200. For example, the second command processing circuit 310 may enable one of the second write enable signal W_en2 and the second read enable signal R_en2 by decoding the command CMD received from the interface circuit 200.

The second command processing circuit 310 may include a second command decoder 311 and a latency circuit 312.

The second command decoder 311 may generate one of a write command W_c and a read command R_c by decoding the command CMD received from the interface circuit 200.

The latency circuit 312 receives the write command W_c or the read command R_c. The latency circuit 312 may delay the write command W_c based on a latency value set in the semiconductor device 300 and output the delayed command as the second write enable signal W_en2, or may delay the read command R_c based on a latency value set in the semiconductor device 300 and output the delayed command as the second read enable signal R_en2.

The second data strobe signal processing circuit 320 may divide the clock CLK and provide the divided clocks to the interface circuit 200 as the data strobe signal DQS. Furthermore, the second data strobe signal processing circuit 320 may receive the data strobe signal DQS from the interface circuit 200 and output the received signal as a write data strobe signal W_dqs.

The second data strobe signal processing circuit 320 may include a second division circuit 321, a second transmission circuit 322, and a second reception circuit 323.

The second division circuit 321 may divide the clock CLK and transmit the divided clocks to the second transmission circuit 322. For example, the second division circuit 321 may divide the clock CLK into four and transmit the divided clocks to the second transmission circuit 322.

The second transmission circuit 322 may transfer the output of the second division circuit 321 to the interface circuit 200 as the data strobe signal DQS in response to the second read enable signal R_en2. For example, when the second read enable signal R_en2 is enabled, the second transmission circuit 322 may transfer the output of the second division circuit 321 to the interface circuit 200 as the data strobe signal DQS.

The second reception circuit 323 may output the data strobe signal DQS, received from the interface circuit 200, as the write data strobe signal W_dqs in response to the second write enable signal W_en2. For example, when the second write enable signal W_en2 is enabled, the second reception circuit 323 may output the data strobe signal DQS, received from the interface circuit 200, as the write data strobe signal R_dqs.

The second data processing circuit 330 may convert the analog data Data_a received from the interface circuit 200 in response to the second write enable signal W_en2 and the write data strobe signal W_dqs, and may output the converted data as the third parallel digital data Data_dp3. The second data processing circuit 330 may generate the analog data Data_a by converting the fourth parallel digital data Data_dp4 in response to the second read enable signal R_en2, and may output the analog data Data_a to the interface circuit 200.

The second data processing circuit 330 may include a second analog digital converter 331 and a second digital analog converter 332.

The second analog digital converter 331 may convert the analog data Data_a into the third parallel digital data Data_dp3 in response to the second write enable signal W_en2 and the write data strobe signal W_dqs, and may output the converted data. For example, the second analog digital converter 331 is activated in the section in which the second write enable signal W_en2 is enabled and the write data strobe signal W_dqs is enabled to a specific level (e.g., a high level). When the second analog digital converter 331 is activated, the second analog digital converter 331 converts the analog data Data_a into the third parallel digital data Data_dp3.

More specifically, an operation of the second analog digital converter 331 is described below with reference to Table 3. In this case, it is assumed that the third parallel digital data Data_dp3 is parallel data of 3 bits. It is to be noted that Table 3 illustrates an operation of the second analog digital converter 331, but the operation of the second analog digital converter 331 is not limited to the numerical values listed in Table 3.

TABLE 3

| Data_a | Data_dp3 | | |
|---|---|---|---|
| 0.1 V | 0 | 0 | 0 |
| 0.2 V | 0 | 0 | 1 |
| 0.3 V | 0 | 1 | 0 |
| 0.4 V | 0 | 1 | 1 |
| 0.5 V | 1 | 0 | 0 |
| 0.6 V | 1 | 0 | 1 |
| 0.7 V | 1 | 1 | 0 |
| 0.8 V | 1 | 1 | 1 |

When the analog data Data_a is input to the activated second analog digital converter 331, the second analog digital converter 331 may determine a data value of the third parallel digital data Data_dp3 based on a voltage level of the analog data Data_a, and may output the third parallel digital data Data_dp3 having the determined data value.

As in Table 3, if the voltage level of the analog data Data_a is 0.1 V, the data value of the second parallel digital data Data_dp2 may be (0, 0, 0). If the voltage level of the analog data Data_a is 0.2 V, the data value of the second parallel digital data Data_dp2 may be (0, 0, 1). If the voltage level of the analog data Data_a is 0.3 V, the data value of the second parallel digital data Data_dp2 may be (0, 1, 0). If the voltage level of the analog data Data_a is 0.4 V, the data value of the second parallel digital data Data_dp2 may be (0, 1, 1). If the voltage level of the analog data Data_a is 0.5 V, the data value of the second parallel digital data Data_dp2 may be (1, 0, 0). If the voltage level of the analog data Data_a is 0.6 V, the data value of the second parallel digital data Data_dp2 may be (1, 0, 1). If the voltage level of the analog data Data_a is 0.7 V, the data value of the second parallel digital data Data_dp2 may be (1, 1, 0). If the voltage level of the analog data Data_a is 0.8 V, the data value of the second parallel digital data Data_dp2 may be (1, 1, 1).

The second digital analog converter 332 may convert the fourth parallel digital data Data_dp4 into the analog data Data_a in response to the second read enable signal R_en2, and may provide the analog data Data_a to the interface circuit 200. For example, the second digital analog converter 332 may be activated when the second read enable signal R_en2 is enabled. The activated second digital analog converter 332 may determine a voltage level of the analog data Data_a based on a data value of the fourth parallel digital data Data_dp4 having a plurality of bits, and may provide the analog data Data_a having the determined voltage level to the interface circuit 200.

More specifically, an operation of the second digital analog converter 332 is described below with reference to Table 4. In this case, it is assumed that the fourth parallel digital data Data_dp4 is parallel data of 3 bits. It is to be noted that Table 4 illustrates an operation of the second digital analog converter 332, but the operation of the second digital analog converter 332 is not limited to the numerical values listed in Table 4.

TABLE 4

| Data_dp4 | | | Data_a |
|---|---|---|---|
| 0 | 0 | 0 | 0.1 V |
| 0 | 0 | 1 | 0.2 V |
| 0 | 1 | 0 | 0.3 V |

TABLE 4-continued

| Data_dp4 | | | Data_a |
|---|---|---|---|
| 0 | 1 | 1 | 0.4 V |
| 1 | 0 | 0 | 0.5 V |
| 1 | 0 | 1 | 0.6 V |
| 1 | 1 | 0 | 0.7 V |
| 1 | 1 | 1 | 0.8 V |

When the fourth parallel digital data Data_dp4 having 3 bits is input to the activated second digital analog converter 332, the second digital analog converter 332 may determine a voltage level of the analog data Data_a based on a data value of the fourth parallel digital data Data_dp4, and may output the analog data Data_a having the determined voltage level.

As in Table 4, if the data value of the fourth parallel digital data Data_dp4 is (0, 0, 0), the voltage level of the analog data Data_a may be 0.1 V. If the data value of the fourth parallel digital data Data_dp4 is (0, 0, 1), the voltage level of the analog data Data_a may be 0.2 V. If the data value of the fourth parallel digital data Data_dp4 is (0, 1, 0), the voltage level of the analog data Data_a may be 0.3 V. If the data value of the fourth parallel digital data Data_dp4 is (0, 1, 1), the voltage level of the analog data Data_a may be 0.4 V. If the data value of the fourth parallel digital data Data_dp4 is (1, 0, 0), the voltage level of the analog data Data_a may be 0.5 V. If the data value of the fourth parallel digital data Data_dp1 is (1, 0, 1), the voltage level of the analog data Data_a may be 0.6 V. If the data value of the fourth parallel digital data Data_dp1 is (1, 1, 0), the voltage level of the analog data Data_a may be 0.7 V. If the data value of the fourth parallel digital data Data_dp4 is (1, 1, 1), the voltage level of the analog data Data_a may be 0.8 V.

Operations of the semiconductor device and the semiconductor system configured as described above in accordance with an embodiment of the present disclosure are described below as an example.

The semiconductor device 300 receives a command CMD and a clock CLK from an external device (e.g., the interface circuit 200) and provides a data strobe signal DQS and analog data Data_a to the external device (e.g., the interface circuit 200), or receives a data strobe signal DQS and analog data Data_a from the external device (e.g., the interface circuit 200).

The semiconductor device 300 may include the second command processing circuit 310, the second data strobe signal processing circuit 320, and the second data processing circuit 330.

The second command processing circuit 310 may include the second command decoder 311 configured to generate a write command W_c or a read command R_c by decoding the command CMD and the latency circuit 312 configured to generate a second write enable signal W_en2 and a second read enable signal R_en2 by delaying the write command W_c or the read command R_c based on a latency value set in the semiconductor device 300.

That is, the second command processing circuit 310 may decode the command CMD received from the external device, and may generate at least one of the second write enable signal W_en2 and the second read enable signal R_en2 by delaying the received command CMD based on a set latency value.

The second data strobe signal processing circuit 320 may include the second division circuit 321 configured to divide the clock CLK, the second transmission circuit 322 configured to provide the output of the second division circuit 321 to the external device as the data strobe signal DQS when the second read enable signal R_en2 is enabled, and the second reception circuit 323 configured to output the data strobe signal DQS, received from the external device, as a write data strobe signal W_dqs when the second write enable signal W_en2 is enabled.

That is, the second data strobe signal processing circuit 320 may divide the clock CLK in response to the second read enable signal R_en2 and provide the divided clocks to the external device as the data strobe signal DQS. In other words, the second data strobe signal processing circuit 320 may generate the data strobe signal DQS in response to the clock CLK and the read enable signal R_en2. Further, the second data strobe signal processing circuit 320 may output the data strobe signal DQS, received from the external device, as the write data strobe signal W_dqs in response to the second write enable signal W_en2.

The second data processing circuit 330 may convert the analog data Data_a, received from the external device, into third parallel digital data Data_dp3 in response to the write data strobe signal W_dqs and the second write enable signal W_en2 and output the third parallel digital data Data_dp3. The second data processing circuit 330 may also convert fourth parallel digital data Data_dp4 into the analog data Data_a in response to the second read enable signal R_en2 and provide the converted analog data Data_a to the external device.

The second data processing circuit 330 may include the second analog digital converter 331 configured to convert the analog data Data_a into the third parallel digital data Data_dp3 in the section in which both the write data strobe signal W_dqs and the second write enable signal W_en2 are enabled. Further, the second digital analog converter 332 may be configured to convert the fourth parallel digital data Data_pd4 into the analog data Data_a and externally output the converted analog data to the external device when the second read enable signal R_en2 is enabled.

That is, the second the data processing circuit 330 may convert the analog data Data_a, received from the external device, into the third parallel digital data Data_dp3 or convert the fourth parallel digital data Data_dp4 into the analog data Data_a, and may provide the third parallel digital data Data_dp3 or the analog data Data_a to the external device.

As a result, if the data strobe signal DQS obtained by dividing the clock CLK is to be provided to the external device in response to the command CMD, the semiconductor device 300 may convert parallel digital data into analog data and provide the parallel digital data to the external device. Furthermore, when the data strobe signal DQS is received from the external device in response to the command CMD, the semiconductor device may convert analog data, received from the external device, into parallel digital data in response to the data strobe signal DQS.

An operation of the semiconductor system including the semiconductor device configured as described above is described below.

The controller 100 may provide a command CMD, a clock CLK, and first parallel digital data Data_dp1 to the interface circuit 200 and may receive second parallel digital data Data_dp2 from the interface circuit 200.

The interface circuit 200 may transfer the command CMD and the clock CLK, received from the controller 100, to the semiconductor device 300, and may transmit or receive a data strobe signal DQS to or from the semiconductor device 300. Furthermore, the interface circuit 200 may convert the first parallel digital data Data_dp1, received from the controller 100, into analog data Data_a and provide the analog data Data_a to the semiconductor device 300, and may convert analog data Data_a, received from the semiconductor device 300, into the second parallel digital data Data_dp2. Further, the interface circuit 200 may provide the second parallel digital data Data_dp2 to the controller 100 in response to the command CMD and the clock CLK.

The interface circuit 200 may include the first command processing circuit 210, the first data strobe signal processing circuit 220, and the first data processing circuit 230.

The first command processing circuit 210 may include the first command decoder 211 configured to enable one of the first write enable signal W_en1 and the first read enable signal R_en1 by decoding the command CMD received from the controller 100 and the command transfer circuit 212 configured to provide the command CMD, received from the controller 100, to the semiconductor device 300.

The first data strobe signal processing circuit 220 may divide the clock CLK and provide the divided clocks to the semiconductor device 300 as the data strobe signal DQS or may output the data strobe signal DQS as a read data strobe signal R_dqs.

The first data strobe signal processing circuit 220 may include the first division circuit 221 configured to divide the clock CLK and output the divided clocks, the first transmission circuit 222 configured to output the output of the first division circuit 221 as the data strobe signal DQS in response to the first write enable signal W_en1, and the first reception circuit 223 configured to output the data strobe signal DQS, received from the semiconductor device 300, as the read data strobe signal R_dqs in response to the first read enable signal R_en1.

That is, when the first write enable signal W_en1 is enabled, the first data strobe signal processing circuit 220 may divide the clock CLK and provide the divided clocks to the semiconductor device 300 as the data strobe signal DQS. Furthermore, when the first read enable signal R_en1 is enabled, the first data strobe signal processing circuit 220 may output the data strobe signal DQS, received from the semiconductor device 300, as the read data strobe signal R_dqs.

The first data processing circuit 230 may convert the first parallel digital data Data_dp1, received from the controller 100, into the analog data Data_a in response to the first write enable signal W_en1 and provide the analog data Data_a to the semiconductor device 300. The first data processing circuit 230 may also convert the analog data Data_a, received from the semiconductor device 300, into the second parallel digital data Data_dp2 in response to the first read enable signal R_en1 and provide the second parallel digital data Data_dp2 to the controller 100.

The first data processing circuit 230 may include the first digital analog converter 231 configured to convert the first parallel digital data Data_dp1 into the analog data Data_a when the first write enable signal W_en1 is enabled and to provide analog data Data_a to the semiconductor device 300. The first data processing circuit 230 may also include the first analog digital converter 232 configured to convert the analog data Data_a, received from the semiconductor device 300, into the second parallel digital data Data_dp2 in the section in which both the first read enable signal R_en1 and the read data strobe signal R_dqs are enabled and to provide the second parallel digital data Data_dp2 to the controller 100.

That is, the first data processing circuit 230 may provide the first parallel digital data Data_dp1, received from the controller 100, to the semiconductor device 300 as the analog data Data_a in response to the command CMD. The first data processing circuit 230 may also convert the analog data Data_a, received from the semiconductor device 300, into the second parallel digital data Data_dp2 in response to the command CMD and provide the second parallel digital data Data_dp2 to the controller 100.

As described above, the semiconductor device 300 may enable one of the second write enable signal W_en2 and the second read enable signal R_en2 in response to the command CMD received from the interface circuit 200.

When the second write enable signal W_en2 is enabled, the semiconductor device 300 may convert the analog data Data_a into third parallel digital data Data_dp3 in response to the data strobe signal DQS received from the interface circuit 200. Furthermore, when the second read enable signal R_en2 is enabled, the semiconductor device 300 may convert fourth parallel digital data Data_dp4 into the analog data Data_a and provide the converted analog data Data_a to the interface circuit 200 in response to the command CMD and the clock CLK. For example, if the burst length of the semiconductor device 300 is 8 and the semiconductor device 300 has a double data rate (DDR), the first and the second division circuits 221 and 321 may divide the clock CLK into four, and each of the first to fourth parallel digital data Data_dp1~Data_dp4 may become parallel data of 8 bits.

The semiconductor system in accordance with an embodiment of the present disclosure is configured to transmit and receive digital data having a plurality of bits between a controller and an interface circuit and to transmit and receive analog data between the interface circuit and a semiconductor device. In this case, each of the interface circuit and the semiconductor device may include a digital analog converter configured to convert digital data into analog data and an analog digital converter configured to convert analog data into digital data in response to a command.

Although various embodiments have been described for illustrative purposes, it will be apparent to those skilled in the art that various changes and modifications may be made without departing from the spirit and scope of the disclosure as defined in the following claims.

What is claimed is:

1. A semiconductor system, comprising:
a first circuit configured to convert first parallel digital data into analog data or convert analog data into second parallel digital data in response to a command and a clock; and
a second circuit configured to convert the analog data received from the first circuit into third parallel digital data or convert fourth parallel digital data into the analog data and provide the converted analog data to the first circuit in response to the command and the clock,
wherein the first circuit includes:
a first processing unit configured to enable one of a write enable signal and a read enable signal in response to the command;
a second processing unit configured to output a data strobe signal and a read data strobe signal; and
a third processing unit configured to convert the first parallel digital data into the analog data or convert the analog data into the second parallel digital data.

2. The semiconductor system of claim 1, wherein
the first processing unit is a command processing circuit configured to enable one of the write enable signal and the read enable signal in response to the command,
the second processing unit is a data strobe signal processing circuit configured to divide the clock and provide the divided clocks to the second circuit as the data strobe signal when the write enable signal is enabled and to output the data strobe signal received from the second circuit as the read data strobe signal when the read enable signal is enabled, and
the third processing unit is a data processing circuit configured to convert the first parallel digital data into the analog data and provide the converted analog data to the second circuit when the write enable signal is enabled and to convert the analog data received from the second circuit into the second parallel digital data in a section in which both the read enable signal and the read data strobe signal are enabled.

3. The semiconductor system of claim 2, wherein the second circuit comprises:
a command processing circuit configured to enable one of the write enable signal and the read enable signal in response to the command,
a data strobe signal processing circuit configured to divide the clock and provide the divided clocks to the first circuit as a data strobe signal when the read enable signal is enabled and to output the data strobe signal received from the first circuit as the write data strobe signal when the write enable signal is enabled, and
a data processing circuit configured to convert the analog data received from the first circuit into the third parallel digital data in a section in which both the write enable signal and the write data strobe signal are enabled and to convert the fourth parallel digital data into the analog data and provide the converted analog data to the first circuit when the read enable signal is enabled.

4. A semiconductor system, comprising:
a controller configured to provide a command, a clock, and first parallel digital data;
an interface circuit configured to convert the first parallel digital data into analog data or convert analog data into second parallel digital data and provide the second parallel digital data to the controller in response to the command and the clock; and
a semiconductor device configured to convert the analog data into third parallel digital data or convert fourth parallel digital data into the analog data and provide the converted analog data to the interface circuit in response to the command and the clock,
wherein the interface circuit includes:
a command decoder configured to enable one of a write enable signal and a read enable signal by decoding the command;
a transmission/reception circuit configured to, in response to the write enable signal and the read enable signal, output a data strobe signal and a read data strobe signal; and
a converter configured to, in response to the write enable signal, the read enable signal, and the read data strobe signal, convert the analog data into second parallel digital data or convert first parallel digital data into the analog data.

5. The semiconductor system of claim 4, wherein the interface circuit further comprises:
a division circuit configured to divide the clock, and
wherein the transmission/reception circuit includes a transmission circuit configured to output an output of the division circuit as the data strobe signal in response to the write enable signal and a reception circuit configured to receive the data strobe signal and output the received data strobe signal as the read data strobe signal in response to the read enable signal, and the converter includes a digital analog converter configured to convert the first parallel digital data into the analog data in response to the write enable signal and an analog digital converter configured to convert the analog data into the second parallel digital data in response to the read enable signal and the read data strobe signal.

6. The semiconductor system of claim 5, wherein the digital analog converter is configured to determine a voltage level of the analog data based on a data value of the digital data.

7. The semiconductor system of claim 5, wherein the analog digital converter is configured to determine a data value of the digital data based on a voltage level of the analog data.

8. The semiconductor system of claim 4, wherein the semiconductor device comprises:
   a command decoder configured to generate a write command and a read command by decoding the command,
   a latency circuit configured to enable one of a write enable signal and a read enable signal by delaying the write command based on a latency value and output the delayed command as the write enable signal, or delay the read command based on the latency value and output the delayed command as the read enable signal,
   a division circuit configured to divide the clock,
   a transmission circuit configured to output an output of the division circuit as a data strobe signal in response to the read enable signal,
   a reception circuit configured to receive the data strobe signal and output the received data strobe signal as a write data strobe signal in response to the write enable signal,
   an analog digital converter configured to convert the analog data into the third parallel digital data in response to the write data strobe signal and the write enable signal, and
   a digital analog converter configured to convert the fourth parallel digital data into the analog data in response to the read enable signal.

9. The semiconductor system of claim 8, wherein the analog digital converter is configured to determine a data value of the parallel digital data based on a voltage level of the analog data.

10. The semiconductor system of claim 8, wherein the digital analog converter is configured to determine a voltage level of the analog data based on a data value of the digital data.

* * * * *